(12) United States Patent
Okuno et al.

(10) Patent No.: US 7,095,079 B2
(45) Date of Patent: Aug. 22, 2006

(54) INJECTION ENHANCED GATE TRANSISTOR INCLUDING SECOND EMITTER IN DUMMY REGION TO PREVENT WAVEFORM VIBRATION ASSOCIATED WITH NEGATIVE GATE CAPACITANCE

(75) Inventors: Takahiro Okuno, Kanagawa (JP); Masahiro Tanaka, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/814,246

(22) Filed: Apr. 1, 2004

(65) Prior Publication Data

US 2005/0156231 A1 Jul. 21, 2005

(30) Foreign Application Priority Data

Jan. 15, 2004 (JP) ............................. 2004-008042

(51) Int. Cl.
*H01L 29/739* (2006.01)
(52) U.S. Cl. ................................. 257/331; 257/E29.198
(58) Field of Classification Search ........ 257/328–331, 257/197; 438/212, 259, 268, 270
See application file for complete search history.

(56) References Cited

U.S. PATENT DOCUMENTS

2003/0042525 A1* 3/2003 Tanaka ........................ 257/302

FOREIGN PATENT DOCUMENTS

JP 2003-204066 7/2003

OTHER PUBLICATIONS

U.S. Appl. No. 09/853,661, filed May 14, 2001, Tanaka.
U.S. Appl. No. 10/230,119, filed Aug. 29, 2002, Tanaka.
U.S. Appl. No. 10/354,048, filed Jan. 30, 2003, Yamaguchi et al.
U.S. Appl. No. 10/437,060, May 14, 2003, Tanaka.
U.S. Appl. No. 10/677,260, filed Oct. 2003, Tanaka et al.
U.S. Appl. No. 10/814,246, filed Apr. 1, 2004, Okuno et al.
I. Omura, et al., IEEE Transactions on Electron Devices, vol. 46, No. 1, pp. 237-244, "Oscillation Effects in IGBT's Related to Negative Capacitance Phenomena", Jan. 1999.
I. Omura, et al., Proceedings of ISPSD, pp. 25-28, "IEGT Design Concept Against Operation Instability and its Impact to Application", May 25, 2000.

* cited by examiner

*Primary Examiner*—Eddie Lee
*Assistant Examiner*—Andrew O. Arena
(74) *Attorney, Agent, or Firm*—Oblon, Spivak, McClelland, Maier & Neustadt, P.C.

(57) ABSTRACT

An injection enhanced gate transistor includes a drift layer, a collector layer and a base layer divided into main cell regions and dummy cell regions by a plurality of trenches formed to extend from the top surface of the base layer into the drift layer. The main cell has a first emitter layer selectively formed in the surface layer of the base layer, gate electrodes formed in the trenches, and an emitter electrode located over the base layer. The dummy cell has a second emitter layer selectively formed so as to be scattered in the surface layer of the base layer and have a surface area smaller than that of the first emitter layer to prevent waveform vibration associate with negative gate capacitance.

14 Claims, 11 Drawing Sheets

INJECTION ENHANCED GATE TRANSISTOR INCLUDING SECOND EMITTER IN DUMMY REGION TO PREVENT WAVEFORM VIBRATION ASSOCIATED WITH NEGATIVE GATE CAPACITANCE

CROSS REFERENCE TO RELATED APPLICATION

This application claims benefit of priority under 35 USC §119 to Japanese Patent Application No. 2004-8042, filed on Jan. 15, 2004, the contents of which are incorporated by reference herein.

BACKGROUND OF THE INVENTION

1. Field of the Invention

The present invention relates to a semiconductor device and it is directed to an insulating gate type bipolar transistor suitable for use as a power supply switching element, for example.

2. Related Background Art

In the field of power semiconductor devices, there is a strong request for low on-voltage and reduction of turn-off loss in addition to enhancement of resistance to high breakdown voltage and availability for larger current. To meet these requirements, IEGT (Injection Enhanced Gate Transistor) has been developed as a further improvement of IGBT (Insulated Gate Bipolar Transistor).

The IEGT is a powering semiconductor device that has realized low on-resistance by rendering the emitter side of an n-type base layer have the peak of carrier concentration rendering it accumulate holes to enhance the efficiency of electron injection from the emitter electrode at the time of turning on.

FIG. 11 is a cross-sectional diagram showing an example of a trench-structured vertical IEGT by a related art. In the IEGT 90 shown here, a p-type collector layer 114 formed on one side of an n-type drift layer (n-type base layer in this example) 100 via an n-type buffer layer 112. On the opposite side of the n-type drift layer 100, a p-type impurity diffusion layer is formed, and a plurality of trenches TR are formed to penetrate the p-type impurity diffusion layer from its surface and reach an inner region of the n-type drift layer 100. Thus, the p-type impurity diffusion layer is divided to main cell regions MC and dummy cell regions DC that are used as p-type main base layers 116 and p-type dummy base layers 118, respectively.

In the surface layer of each p-type main base layer 116 of the main cell region MC, n-type emitter layers 124 are formed selectively. The surface of each p-type dummy base layer 118 of the dummy cell region DC is covered by an insulating film 132 to keep the potential of the p-type dummy base layer 118 floating.

A collector electrode 126 is formed on the p-type collector layer 114. An emitter electrode 128 is formed over the p-type main base layer 116 and the n-type emitter layers 124, and it is connected to the n-type emitter layer 124. In each trench TR, a gate electrode 122 is buried via a gate insulating film 120. As a result of the explained structure, an n-type channel MOSFET for electron injection using the p-type main base layer 116 as a channel region and selectively connecting the n-type emitter layers 124 to the n-type drift layer 100 is formed in each main cell region MC.

In the IEGT 90 shown in FIG. 11, the drift layer 100 of the main cell region MC has the carrier concentration profile having the peak on the part of the emitter electrode 128. Therefore, a sufficiently narrow current path is formed, which connects the n-type drift layer 100 and the emitter electrode 128. As a result, in the on-state of the IEGT 90, the current path increases the resistance to the flow of holes moving from the n-type drift layer 100 toward the emitter electrode 128 through the p-type main base layer 116 of the main cell region MC, and hence limits the discharge of holes to the emitter electrode 128. This results in enhancing the electron injection efficiency from the n-type emitter layer 124 to the n-type drift layer 100, promoting the conductivity modulation of the n-type drift layer 100, and attaining a low on-voltage.

The IEGT 90 shown in FIG. 11, however, involves the problem that the gate voltage runs to overshoot due to so-called negative capacitance, and thereby becomes impossible to control the voltage change rate dV/dt during the on-time. This problem is explained below with reference to FIGS. 12 and 13. In the attached figures, common and equivalent elements are labeled with common reference numerals, and their explanation will be repeated only when necessary.

FIG. 12 is a graph showing an example of voltage and current waveform at the on-time of the IEGT 90 shown in FIG. 11. In this graph, $V_{ge}$ is a gate-emitter voltage, $V_{ce}$ is a collector-emitter voltage, and $I_c$ is a collector current.

In this experiment, the voltage of the IEGT was 1200 V, the voltage applied between the collector and the emitter was 600V, and the gate resistance $R_g$ was 51Ω. Resistance between the p-type dummy base layer 118 and the emitter electrode 128 was 10Ω.

As shown in FIG. 12, the collector-emitter voltage change ratio (dV/dt) of the IEGT 90 shown in FIG. 11 was as large as 20 kV/μs or more in the initial stage of the mirror period t1~t2 (the period for charging between the gate and the collector with the voltage applied between the gate and emitter), and the waveform vibrated seriously.

FIG. 13 is a graph showing an example of the gate charge characteristics during the on-time of the IEGT 90 shown in FIG. 11, which was obtained by a simulation. In this graph, $V_{ge}$ is the gate-emitter voltage, $V_{ce}$ is the connector-emitter voltage, and $Q_g$ is the gate charge. Solid lines show characteristics obtained by dynamic calculation whereas broken lines show characteristics obtained by static calculation ($V_{ce}$=0V and $V_{ce}$=600V). Conditions of the IEGT in this simulation are equal to those explained in conjunction with FIG. 12 except the parameters of this simulation.

In the IEGT 90 shown in FIG. 11, the gate-emitter voltage $V_{ge}$ (hereinbelow referred to as $v_{ge(on)}$) in the mirror period (the period t1–t2 in FIG. 12) is contained in the $V_{ge}$ region where $Q_g$ decreases as $V_{ge}$ increases in the static characteristics of $V_{ce}$=600V. In this case, the waveform of $Q_g$ significantly vibrates on the dynamic characteristics as shown in FIG. 13.

The phenomenon of the decrease of $Q_g$ with the increase of $V_{ge}$ is called negative capacitance (negative capacitance of the gate) because $C_g$=$dQ_g/dV_{ge}$ becomes a negative value. The negative capacitance is known as being the cause of bringing about current unbalance upon parallel driving of a semiconductor device (see, for example, Japanese Patent Laid Open (kokai) 2000-40951 and IEEE Device Letters, vol. 18, pp 121–123.)

As seen in the dynamic characteristics of FIG. 13, once the gate emitter voltage $V_{ge}$ (on) in the mirror period enters in the $V_{ge}$ region exhibiting the negative capacitance, the gate-emitter voltage $V_{ge}$ vibrates. This results in increasing the gate-emitter voltage $V_{ge}$ in a short time and permitting rapid electrical conduction of the collector current to invite a large dV/dt.

Through some researches, the Inventor has confirmed that the overshoot of the gate-emitter voltage $V_{ge}$ by such negative capacitance occurs because the potential of the p-type dummy base layer in the dummy cell region is not kept floating completely.

In greater detail, even when the device is designed to keep the potential of the p-type dummy base layer floating as explained before, if the potential in the off-time is fixed near the zero potential via a parasitic resistance caused by the parasitic structure (for example, partial connection to the cell end or the junction terminal end), after the device is turned on, immediately upon the rise of the gate-emitter voltage $V_{ge}$ (on) to the threshold voltage $V_{th}$, holes injected thereby suddenly increase the potential of the p-type dummy base layer and ultimately bring about the overshoot of the gate-emitter voltage $V_{ge}$.

On the other hand, if the emitter contact is formed over the entire surface of the dummy base layer, then the problem of uncontrollability of dV/dt will be overcome. In this case, however, the IE effect will be lost, and the low $V_{ce\ (sat)}$ characteristics cannot be realized.

To prevent this problem, the use of the structure described in Japanese Patent Laid Open (kokai) 2000-40951, for example, leads to realization of complete floating configuration of the dummy base layer while maintaining the IE effect.

However, in the structure described in Japanese Patent Laid Open (kokai) 2000-40951, if the cell length is changed, for example, when the current capacitance is different, then the structure must be changed as well accordingly. Therefore, the structure disclosed in Japanese Patent Laid Open (kokai) 2000-40951 involves the problem that it lacks compatibility or commonness as a unit structure.

BRIEF SUMMARY OF THE INVENTION

According to a first aspect of the present invention, there is provided a semiconductor device comprising:
a drift layer of a first conductivity type;
a collector layer of a second conductivity type located on the drift layer;
a collector electrode located on the collector layer;
a base layer of the second conductivity type located in a region isolated from the collector layer on the drift layer;
a plurality of trenches formed at certain intervals to extend from the top surface of the base layer into the drift layer and thereby divide the base layer to main cell regions and dummy cell regions;
a first emitter layer of the first conductivity type selectively formed in the surface layer of the base layer in each main cell region to extend along adjacent one of the trenches;
gate electrodes formed in the trenches sandwiching each main cell region among said plurality of trenches via a gate insulating film;
an emitter electrode located over the base layer and the first emitter layer in each main cell region; and
a second emitter layer of the first conductivity type selectively formed so as to be scattered in the surface layer of the base layer in each dummy region and having a surface area smaller than that of the first emitter layer.

According to a second aspect of the present invention, there is provided a semiconductor device comprising:
a drift layer of a first conductivity type;
a collector layer of a second conductivity type located on the drift layer;
a collector electrode located on the collector layer;
a base layer of the second conductivity type located in a region isolated from the collector layer on the drift layer;
a plurality of trenches formed at certain intervals to extend from the top surface of the base layer into the drift layer and thereby divide the base layer to main cell regions and dummy cell regions;
a first emitter layer of the first conductivity type selectively formed in the surface layer of the base layer in each main cell region to extend along adjacent one of the trenches;
gate electrodes formed in the trenches sandwiching each main cell region among said plurality of trenches via a gate insulating film;
an emitter electrode located over the base layer and the first emitter layer in each main cell region; and
a second emitter layer selectively formed in the surface layer of the base layer in each dummy cell region,
wherein resistance value of a floating resistor as a resistance between the base layer of the dummy cell region and the emitter electrode is adjusted to be smaller than the resistance value causing rise of the gate-emitter voltage due to negative capacitance of the gate in a period to charge the gate and the collector by a voltage applied between the gate and the emitter when the device is turned on.

BRIEF DESCRIPTION OF THE DRAWINGS

In the accompanying drawings.

DETAILED DESCRIPTION OF THE INVENTION

Some embodiments of the invention will be explained below with reference to the drawings. In the explanation made below, the first conductivity type refers to the n-type and the second conductivity type refers to the p-type.

FIRST EMBODIMENT

Figure 1:
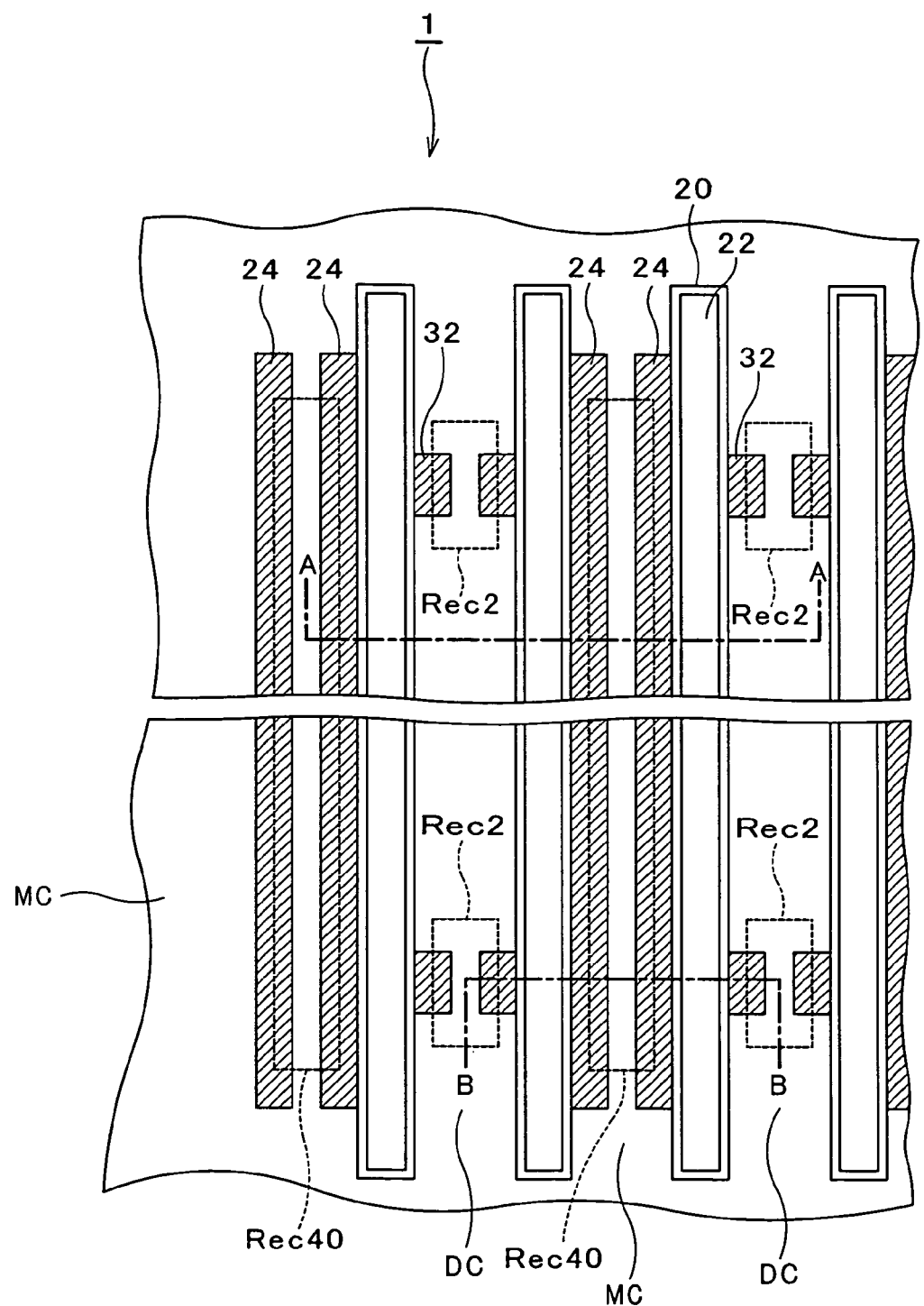
FIG. 1 is a plan view showing schematic configuration of a semiconductor device according to a first embodiment of the invention.
Figure 2:
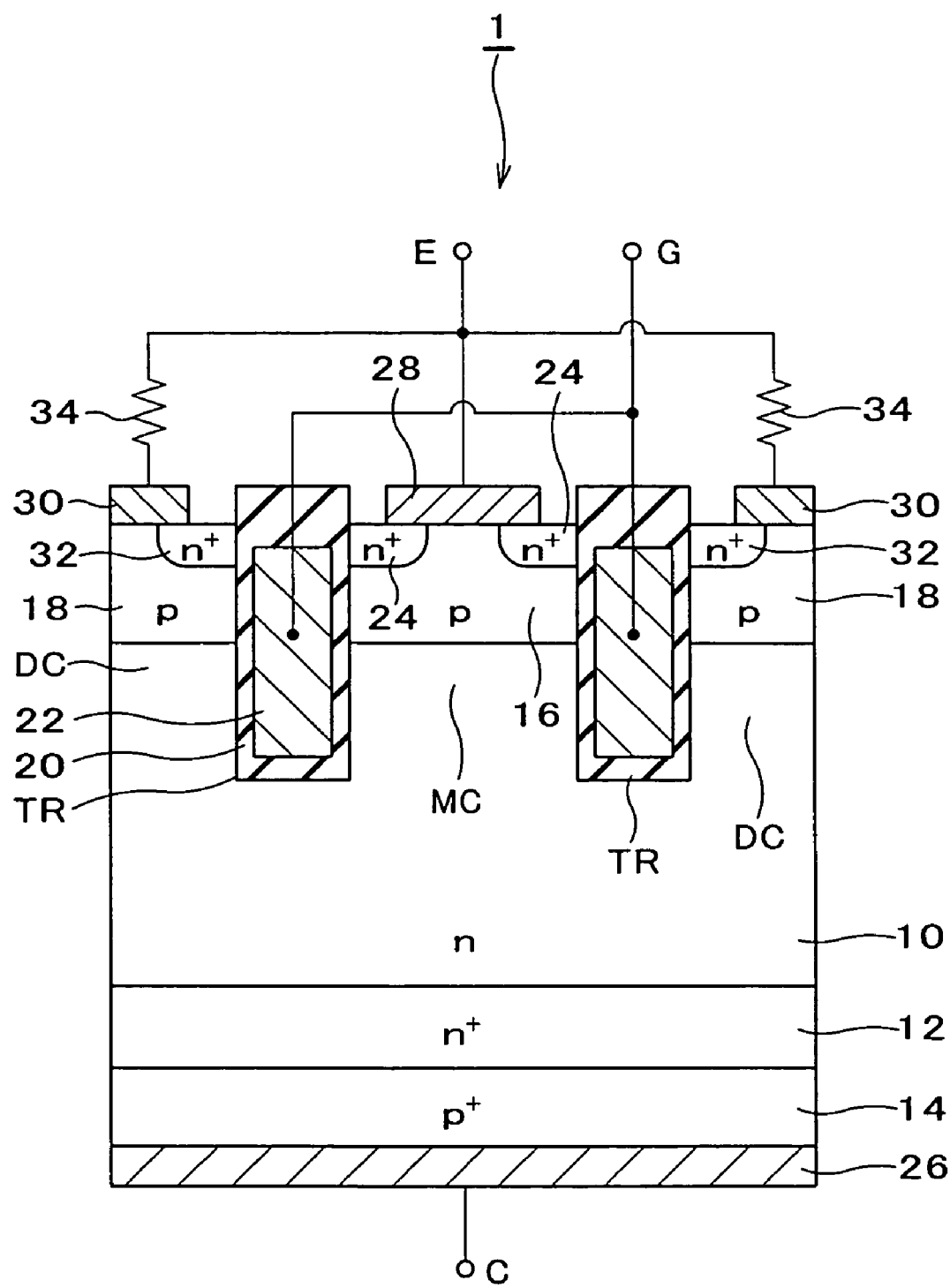
FIG. 2 is a cross-sectional view taken along the B—B line of FIG. 1.
Figure 3:
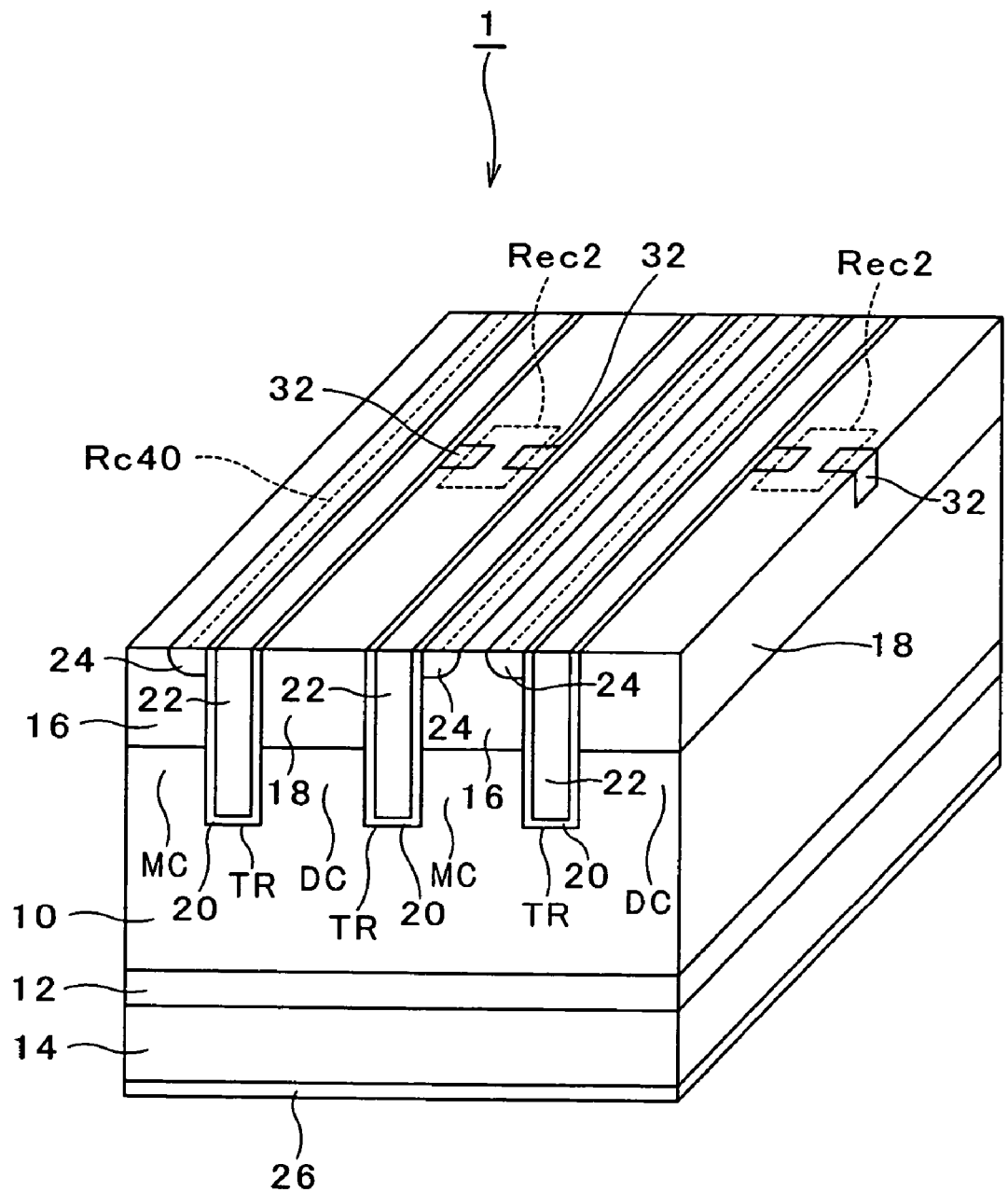
FIG. 3 is a cross-sectional perspective view taken along the A—A cut line of FIG. 1.

FIG. 1 is a plan view showing schematic configuration of a semiconductor device according to the first embodiment of the invention. FIG. 2 is a cross-sectional view taken along the B—B line of FIG. 1, and FIG. 3 is a cross-sectional perspective view taken along the A—A cut line of FIG. 1.

As shown in the cross-sectional view of FIG. 2, the IEGT 1 according to this embodiment includes an n-type drift layer (n-type base layer) 10, n-type buffer layer 12, p-type collector layer 14, first p-type base layers 16, second p-type base layers 18, first emitter layers 24, second emitter layers 32, trenches TR, gate insulating films 20, gate electrodes 22, emitter electrodes 28, via contacts 30 and collector electrode 26.

The p-type collector layer 14 lies on one side of the n-type drift layer 10 via the n-type buffer layer 12. On the other side of the n-type drift layer 10, a p-type base layer (16, 18) is formed. A plurality of trenches TR are formed at certain intervals so as to penetrate the p-type base layer from its surface and reach a region in the n-type drift layer 10. Thus, main cell regions MC and dummy cell regions DC are defined in the surface region of the p-type base layer, and the p-type base layer is divided to the first base layer 16 and the second base layer 18 in each unit region. Instead of dividing the common p-type base layer by the trenches TR, it is also possible to form the first p-type base layer 16 and the second p-type base layer 18 as independent layers.

The first emitter layers 24 are selectively formed in the surface layer of each p-type base layer 16. The emitter electrode 28 is located to locally contact the surfaces of the first emitter layers 24 opposed and the surface of the first base layer 16 between the opposed first emitter layers 24 in each main cell region MC.

The gate electrode 22 is formed in each trench TR so as to be covered by the gate insulating film 20. The collector electrode 26 is located in contact with the collector layer 14.

The second emitter layer 32 is one of unique features of the IEGT 1 according to this embodiment, and it is selectively formed in the surface layer of the second base layer 18 in a pattern of narrow isolated layers (see FIG. 1) in the dummy cell regions DC. In this embodiment, the second emitter layers 32 are formed to make an opposed pair in each dummy cell region DC, and respective ends of the second emitter layers 32 contact nearest trenches TR as also shown in the cross-sectional perspective view of FIG. 3. The second emitter layers 32 make a current path for transferring holes to the emitter electrode 28 to an extent not affecting the electron injection efficiency from the emitter electrode 28 to the n-type drift layer 10 in the on-time of the device.

As also shown in FIG. 3, each via contact 30 is located in contact with the surface regions of the second emitter layers 32 and the location of the second base layer 18 sandwiched by the second emitter layers 32 (emitter contact region Rec2) is located so as to electrically connect the second base layer 18 to the emitter electrode 28. The via contacts 30 and the emitter layers 32 form floating resistors 34. Therefore, resistance value of each floating resistor 34 is adjusted by shapes or geometries of the emitter layer 32 and the via contact 30.

Figure 4:
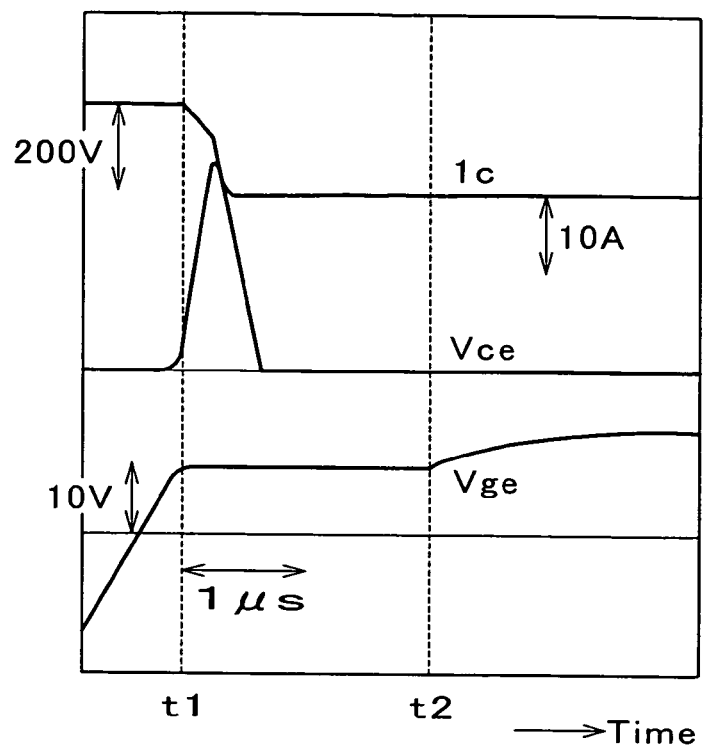
FIG. 4 is a graph showing the voltage and the current waveforms at the turn-on time of the IEGT shown in FIG. 1.

FIG. 4 is a graph showing the voltage and the current waveforms at the turn-on time of the IEGT 1 according to this embodiment, which was obtained experimentally. In the IEGT 1 according to this embodiment, actually used in this experiment, resistance voltage was 1200 V, voltage applied to the collector and the emitter was 600 V, and the gate resistance Rg was 51 Ω.

Figure 12:
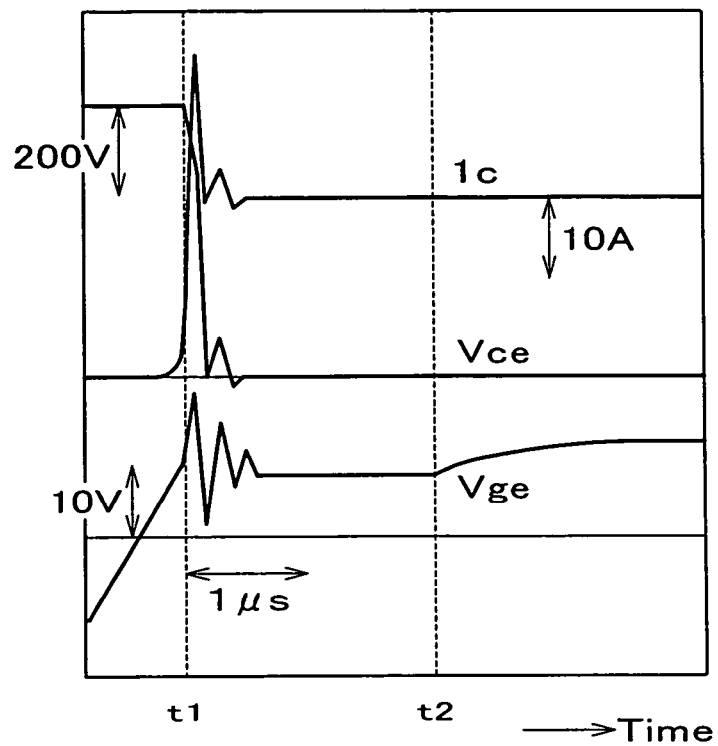
FIG. 12 is a graph showing an example of voltage and current waveform at the on-time of the IEGT shown in FIG. 11.

As shown in FIG. 4, in the IEGT 1 according to the instant embodiment, since the second base layer 18 is connected to the emitter electrode 28 via the via contact 30, potential of the base layer 18 is not fixed to zero even in the off-time. A local channel region is then formed in the dummy cell region DC in the second base layer 18 under the second emitter regions when the device is turned on. Therefore, dV/dT at the initial stage of the mirror period t1–t2 is reduced to approximate 5 kV/µs, and waveform vibration is suppressed as well. This is in contrast to the conventional IEGT in which the voltage change ratio (dV/dt) is approximate 20 kV/µs and the waveform vibrates violently (see FIG. 12).

Figure 5:
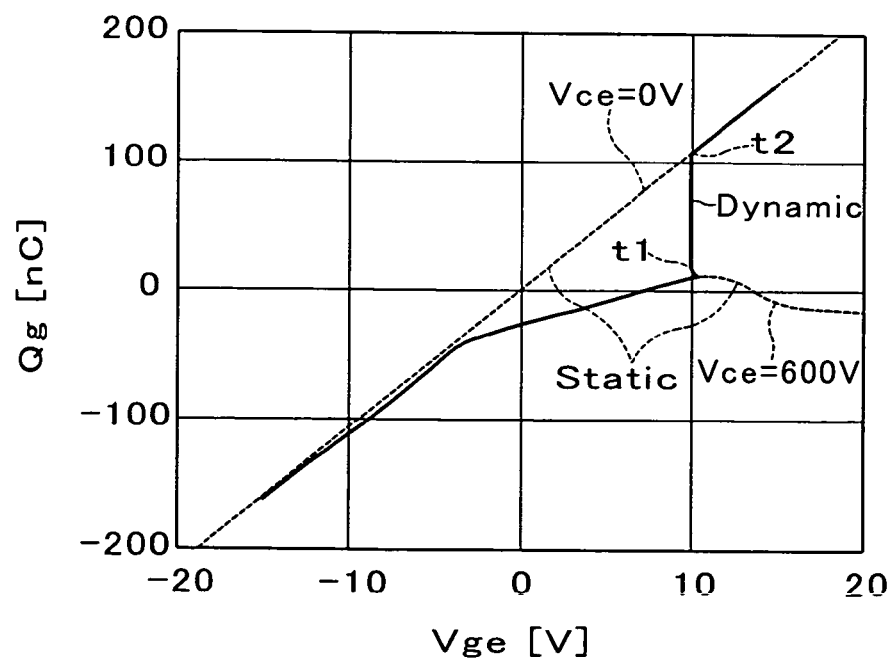
FIG. 5 is a graph showing an example of gate charge characteristics appearing when the IEGT 1 is turned on, which are obtained by simulation.

FIG. 5 is a graph showing an example of gate charge characteristics appearing when the IEGT 1 is turned on, which were obtained by simulation. Conditions of IEGT used in the simulation were identical to those explained in conjunction with FIG. 4 except the parameters of this simulation.

Figure 13:
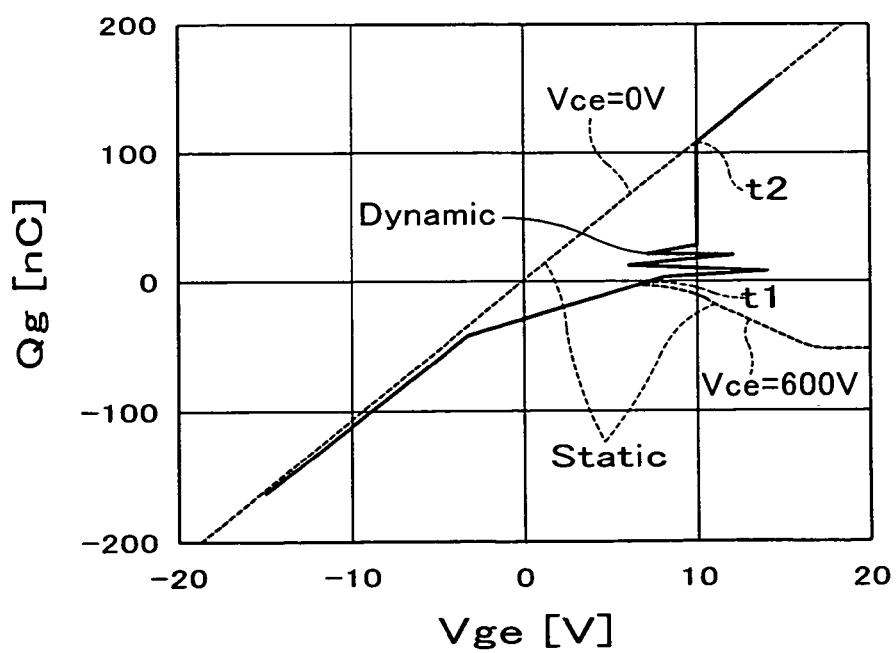
FIG. 13 is a graph showing an example of the gate charge characteristics during the on-time of the IEGT shown in FIG. 11, which was obtained by a simulation.

In the IEGT 1 according to this embodiment, the region of $V_{ge}$ exhibiting the negative capacitance is shifted to the high-voltage side, and $V_{ge(on)}$ is not included in this region. In this case, almost no vibration is found in the waveform of $Q_g$ in the dynamic characteristics. This is in contrast to the conventional IEGT in which $V_{ge\ (on)}$ is in the $V_{ge}$ region exhibiting negative capacitance and the waveform of $Q_g$ violently vibrates in the dynamic characteristics (see FIG. 13).

In the instant embodiment, resistance value $R_{float}$ of the floating resistor 34 is adjusted by the shape of the second n-type emitter layers 32 locally formed as isolated regions in the surface layer of the second p-type base layer 18 and the shape of the via contact 30. Adjustment of the resistance value $R_{float}$ to an appropriate value contributes to preventing the $V_{ge\ (on)}$ from being included in the $V_{ge}$ region exhibiting the negative capacitance and preventing vibrations of $V_{ge}$ and high dV/dt caused thereby while maintaining the IE effect.

Figure 6A:
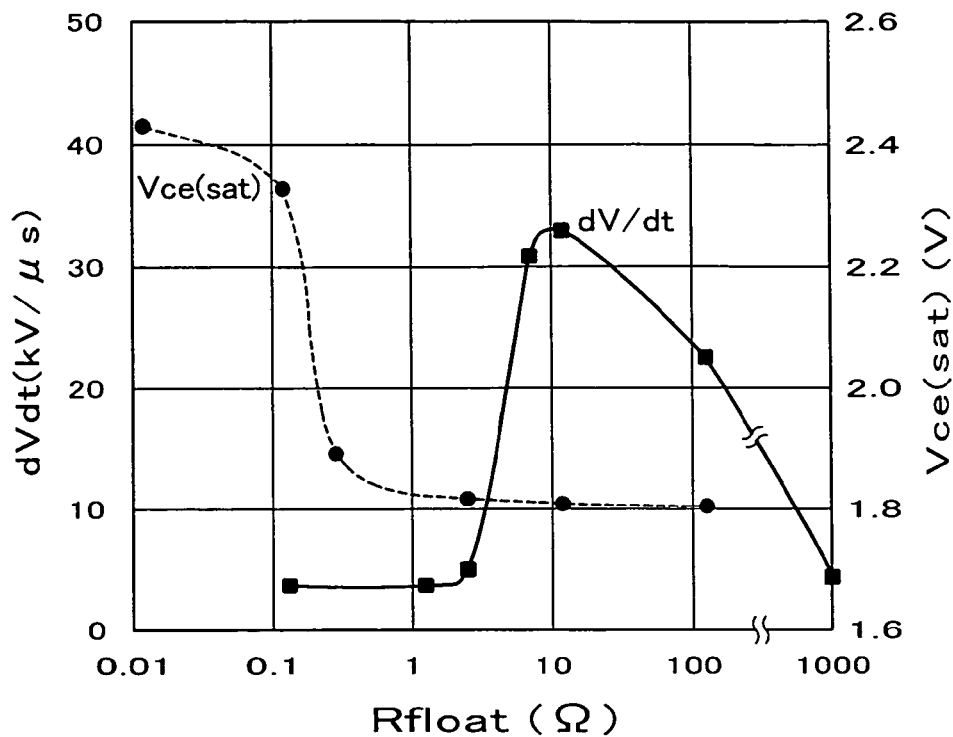
FIG. 6A is a graph showing a relation of dV/dt and on-voltage relative to the resistance value $R_{float}$ of the floating resistor, which is obtained by simulation.
Figure 6B:
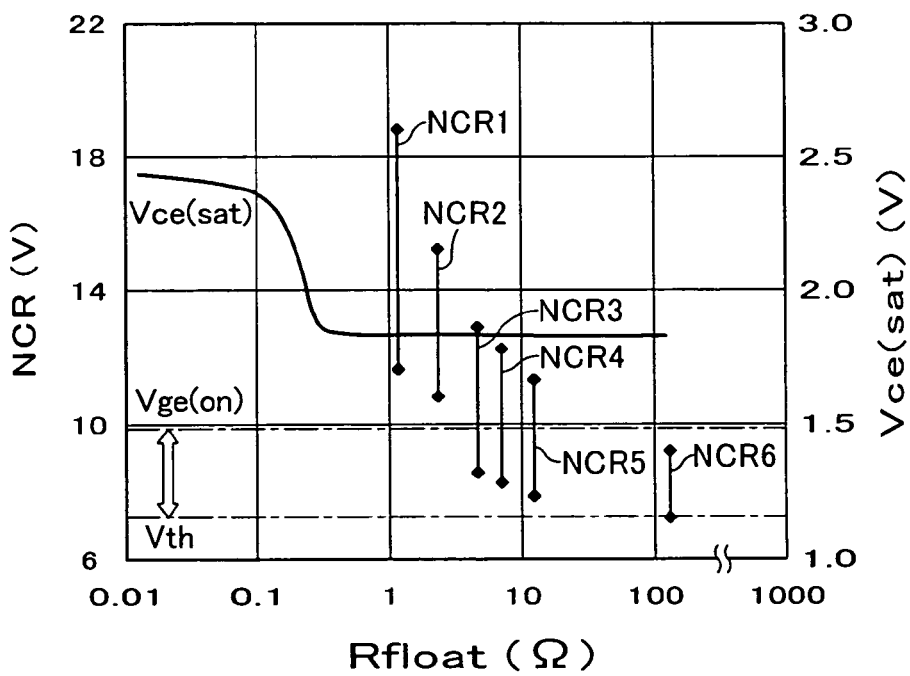
FIG. 6B is a graph showing a relation of the range NCR of $V_{ge}$ exhibiting negative capacitance and on-voltage relative to the resistance value $R_{float}$ of the floating resistor.

FIG. 6A is a graph showing a relation of dV/dt and on-voltage relative to the resistance value $R_{float}$ of the floating resistor, which is obtained by simulation. FIG. 6B is a graph showing a relation of the range NCR of $V_{ge}$ exhibiting negative capacitance and on-voltage relative to the resistance value $R_{float}$ of the floating resistor.

In these graphs, $V_{ce\ (sat)}$ is the collector-emitter voltage (saturation voltage) in the on-sate, $V_{ge\ (on)}$ is the gate-emitter voltage under no vibrations in the mirror period, and $V_{th}$ is the gate threshold voltage. Conditions of IEGT used in the simulation are identical to those explained in conjunction with FIG. 4 except the parameters of this simulation. The desirable range of the resistance value $R_{float}$ of the floating resistor 34 is the range where $V_{ce\ (sat)}$ is low and dV/dt is small in FIG. 6A. Under these experimental conditions, the desirable range of $R_{float}$ is approximately 0.3–3Ω.

As shown in FIG. 6B, the higher the resistance value $R_{float}$ of the floating resistor 34, the lower the value of the range NCR1~NCR6 of $V_{ge}$ exhibiting negative capacitance. In NCR3~NCR6 where $R_{float}$ is equal to or larger than 5Ω, their ranges overlap $V_{ge\ (on)}$ or are located under $V_{ge\ (on)}$. This means that $V_{ge\ (on)}$ of the mirror period is included in the $V_{ge}$ region exhibiting negative capacitance. Therefore, $V_{ge}$ vibrates and rises in a short time. Here is the problem that a large dV/dt is brought about by a sudden flow of the collector current.

On the other hand, the range of $V_{ge}$ in the instant embodiment belongs to NCR1 and NCR2 where $R_{float}$ is equal to or lower than 3 Ω, and these ranges are positioned above $V_{ge\ (on)}$. In this case, since $V_{ge}$ takes the turn-on state before affected by the negative capacitance, overshoot of $V_{ge}$ is prevented, and dV/dt is controlled in an appropriate value. The aforementioned relation between $R_{float}$ and $V_{ge\ (on)}$ has been described in U.S. Pat. application Ser. No. 10/354,048, the contents of which are incorporated herein by reference.

As such, according to the IEGT 1 of the instant embodiment, it is possible to realize a semiconductor element excellent in controllability of dV/dt without losing the $V_{ce\ (sat)}$ characteristics by the IE effect.

SECOND EMBODIMENT

Figure 7:
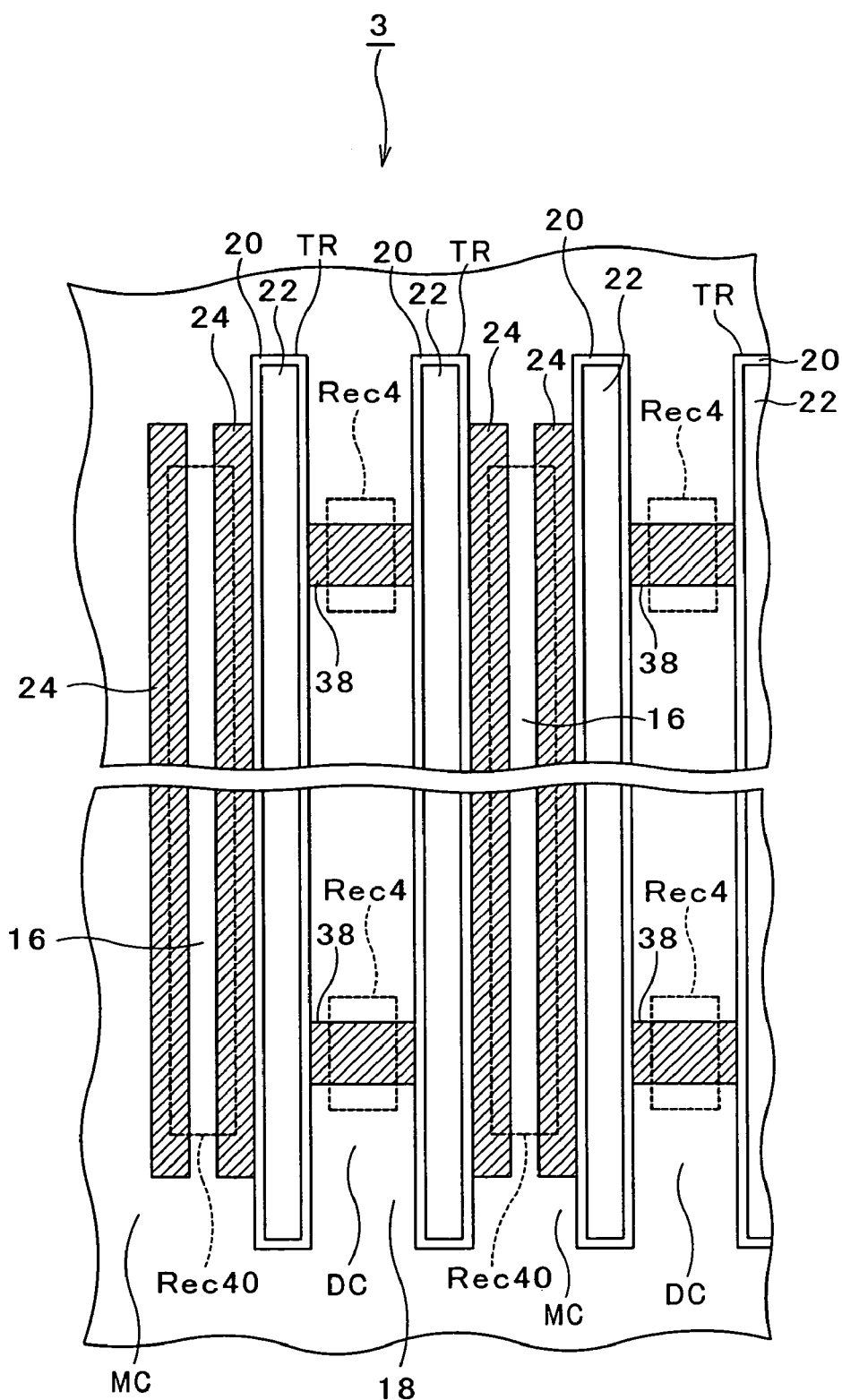
FIG. 7 is a plan view schematically showing the configuration of a semiconductor device according to a second embodiment of the invention.

FIG. 7 is a plan view schematically showing the configuration of a semiconductor device according to the second embodiment of the invention. The IEGT 3 shown here includes a second emitter layers 38 extending in form of an island to contact at its opposite ends with the trenches defining each dummy cell region DC. The contact region Rec4 of the via contact with the emitter electrode 28 in each dummy cell region DC includes only the central portion of the top surface of the second emitter layer 38 and its peripheral portion. The other configuration of the IEGT 3 is substantially identical to that of the IEGT 1 shown in FIG. 1.

Also when the island-shaped second emitter layer 38 is used for emitter contact, functions and effects of the IEGT 3 of this embodiment are substantially the same as the first embodiment.

THIRD EMBODIMENT

Figure 8:
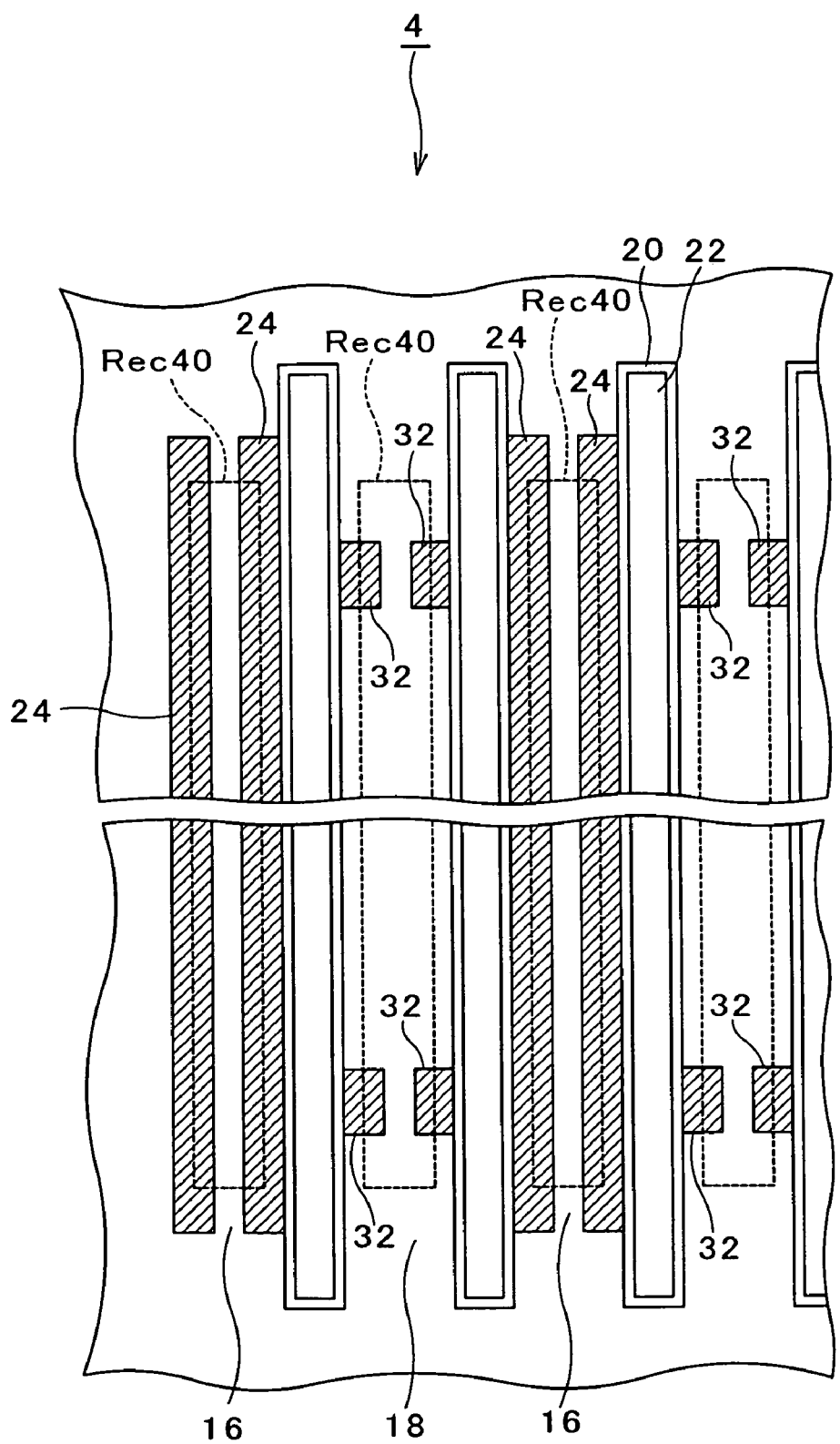
FIG. 8 is a plan view schematically showing the configuration of a semiconductor device according to a third embodiment of the invention.

FIG. 8 is a plan view schematically showing the configuration of a semiconductor device according to the third embodiment of the invention. Similarly to the IEGT 1 shown in FIG. 1, the IEGT 4 shown here comprises second emitter layers 32 selectively formed as isolated regions in the surface layer of each second base layer 18 to make a pair, both of which are in contact with trenches TR at their respective ends. On the other hand, the second emitter regions 32 and the second base layer 18 are connected to the emitter electrode 28 in a contact region Rec40 similar to the emitter contact in the main cell region MC via a via contact not shown.

The IEGT 4 according to the instant embodiment having this configuration also has the same functions and effects as those of the first embodiment.

FOURTH EMBODIMENT

Figure 9:
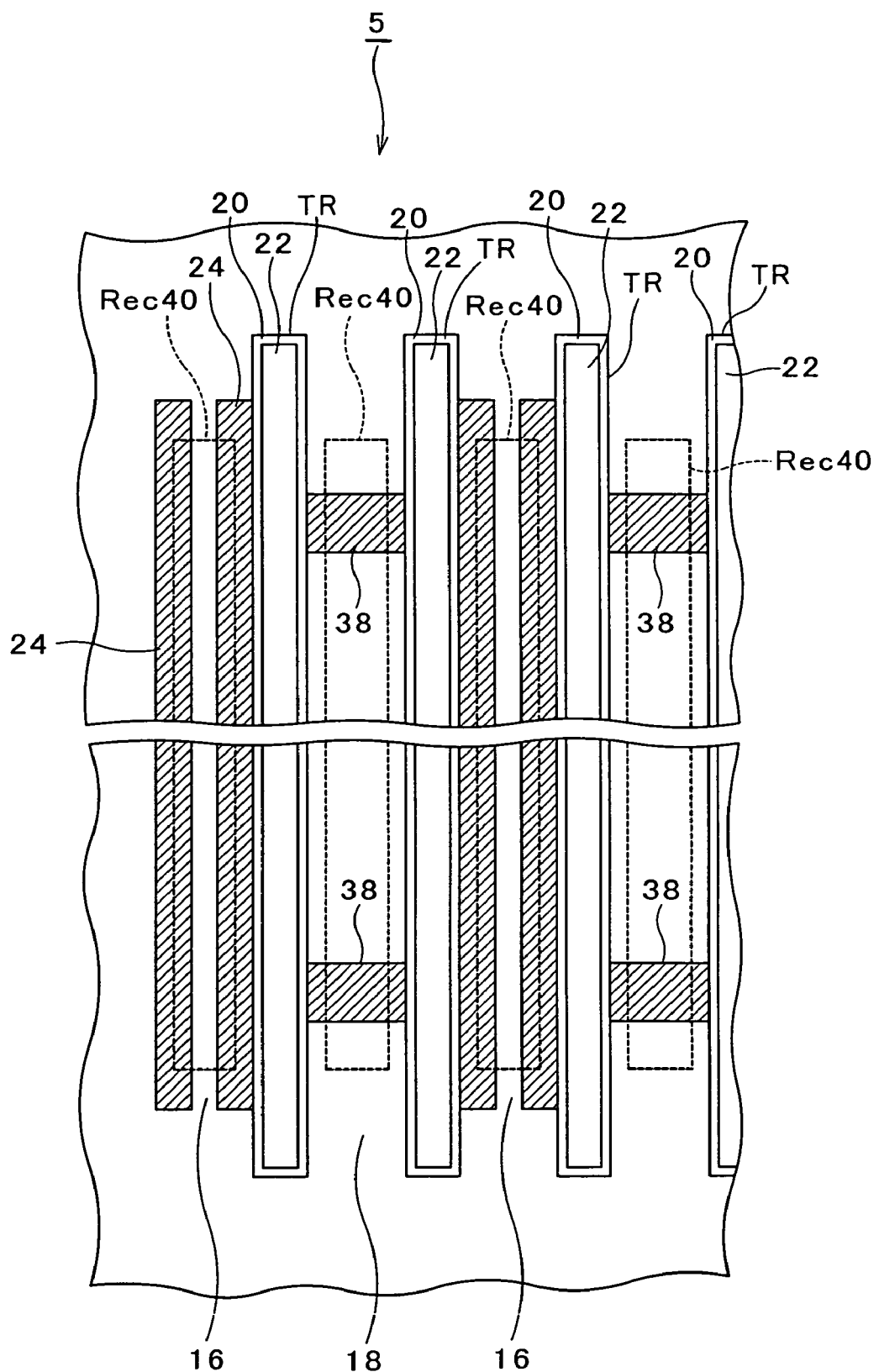
FIG. 9 is a plan view schematically showing the configuration of a semiconductor device according to a fourth embodiment of the invention.

FIG. 9 is a plan view schematically showing the configuration of a semiconductor device according to the fourth embodiment of the invention. The IEGT 5 shown here comprises a second emitter layer 38 having the same geometry as that of the IEGT 3 shown in FIG. 7 and located in the surface layer of each second base layer 18. The second emitter layers 38 and the second base layer 18 are connected to the emitter electrode 28 in the contact region Rec40, which is similar to that of the IEGT 4 according to the third embodiment already explained, via a via contact not shown.

The IEGT 5 according to the instant embodiment having this configuration also has the same functions and effects as those of the first embodiment.

FIFTH EMBODIMENT

Figure 10:
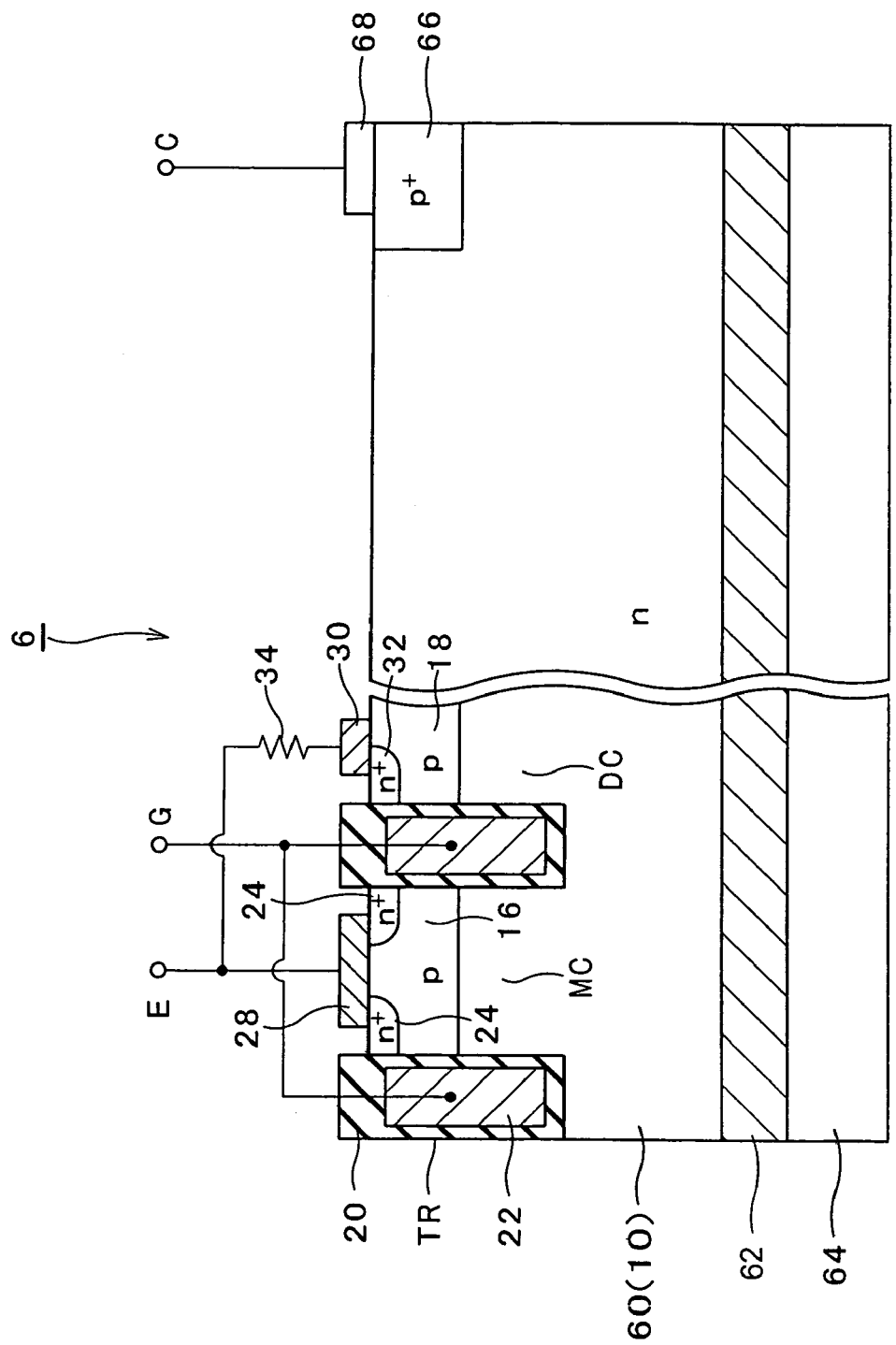
FIG. 10 is a cross-sectional view schematically showing the configuration of a semiconductor device according to a fifth embodiment of the invention.
Figure 11:
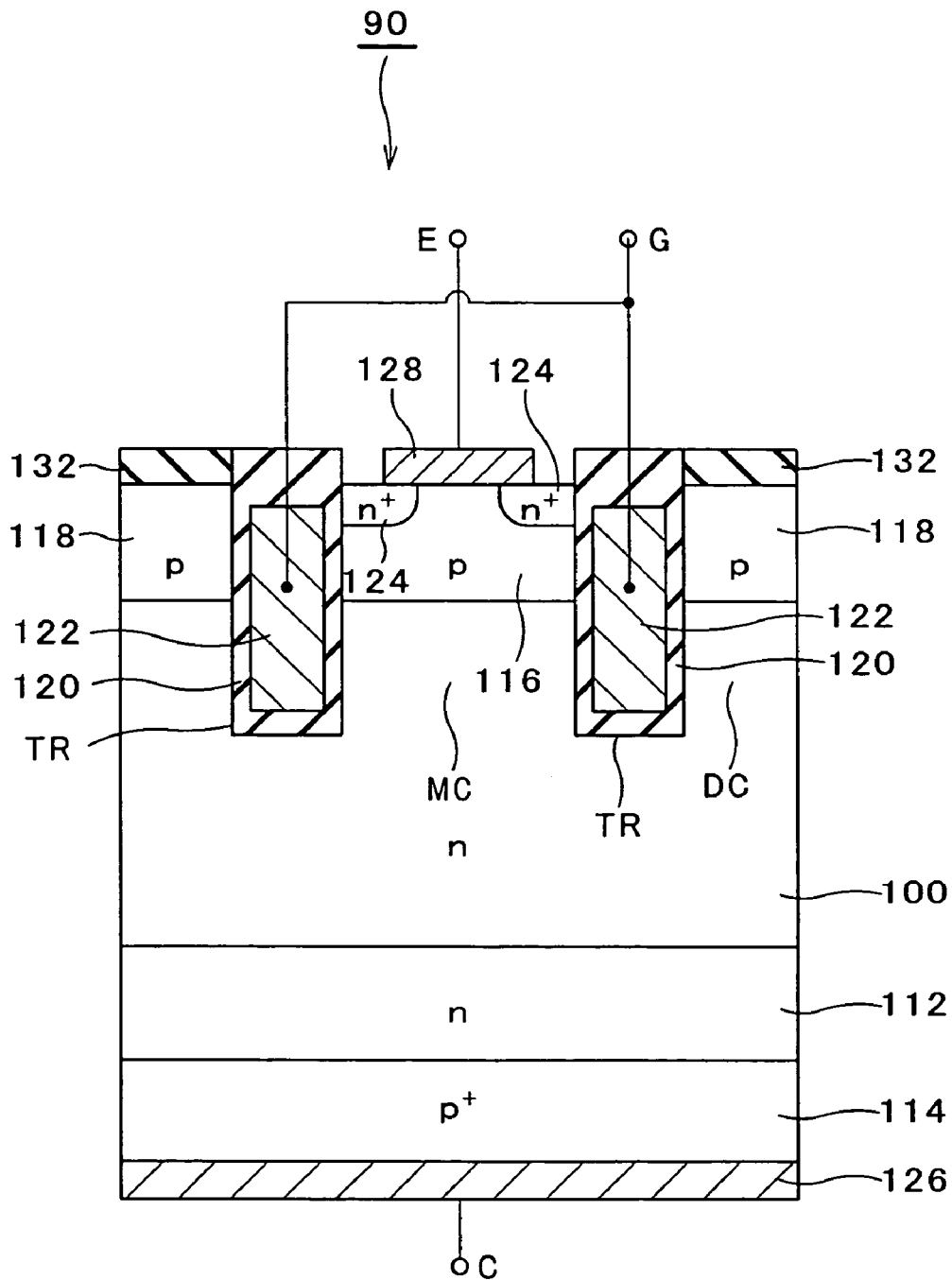
FIG. 11 is a cross-sectional diagram showing an example of a trench-structured vertical IEGT by a related art.

FIG. 10 is a cross-sectional view schematically showing the configuration of a semiconductor device according to the fifth embodiment of the invention. The foregoing embodiments have been explained taking vertical type IEGTs 1, 3 through 5. In the instant embodiment, however, a lateral type power semiconductor device equivalent to the former IEGT in function is taken as an example.

The IEGT 6 shown in FIG. 10 is formed on a SOI (silicon-on-insulator) substrate having a semiconductor support layer 64, insulating layer 12 and a semiconductor active layer 60. The active layer 60 is used as a high-resistance n-type drift layer (n-type base layer) 10. On a right portion of FIG. 10, a p-type collector layer 66 and a collector electrode 68 are located. In a region of a left portion of FIG. 10, which is remote from the p-type collector layer 66, a p-type base layer is formed on the n-type drift layer 10, and trenches TR are formed from the top surface of the p-type base layer. Thus, the p-type base layer is divided to the first base layer 16 of the main cell region MC and the second base layer 18 of the dummy cell region DC. Around the trenches TR, the same structure as the upper part of the IEGT 1 of FIG. 2 is formed.

In the IEGT 1 shown in FIG. 2, having the vertical structure in which the collector electrode 26 and the emitter electrode 28 are formed to sandwich the substrate, the main current flows vertically through the n-type drift layer 10. In contrast, in the IEGT 6 shown in FIG. 10, having the lateral type structure in which the collector electrode 68 and the emitter electrode 28 are located on a common side of the substrate, the main current flows laterally in the n-type drift layer 10. In the other respects, however, both these types of devices work under identical operational principles. As such, the present invention is applicable not only to vertical type IEGTs but also to lateral type IEGTs.

The invention has been explained by way of some embodiments. These embodiments, however, should not be construed to any limitation of the present invention. Rather, the present invention should be understood to include all possible embodiments and modification to the shown embodiments which can be embodied without departing from the scope and spirit thereof as set forth in the appended claims.

What is claimed is:

1. A semiconductor device comprising:
  a drift layer of a first conductivity type;
  a collector layer of a second conductivity type located on the drift layer;
  a collector electrode located on the collector layer;
  a base layer of the second conductivity type located in a region isolated from the collector layer on the drift layer;
  a plurality of trenches formed at certain intervals to extend from the top surface of the base layer into the drift layer and thereby divide the base layer to main cell regions and dummy cell regions;
  a first emitter layer of the first conductivity type selectively formed in the surface layer of the base layer in each main cell region to extend along adjacent one of the trenches;

gate electrodes formed in the trenches sandwiching each main cell region among said plurality of trenches via a gate insulating film;

an emitter electrode located over the base layer and the first emitter layer in each main cell region; and a second emitter layer of the first conductivity type selectively formed so as to be scattered in the surface layer of the base layer in each dummy region and having a surface area smaller than that of the first emitter layer.

2. The semiconductor device according to claim 1,
wherein the drift layer of the main cell region has a carrier concentration profile having a peak on the side of the first emitter layer.

3. The semiconductor device according to claim 2,
wherein the drift layer of the main cell region forms a current path narrow enough to accumulate a carrier of the second conductivity type on and around the bottom of the trenches when the device is turned on, and wherein the second emitter layer forms a current path conducting a carrier of the second conductivity type to the emitter electrode by an amount not affecting the injection efficiency of the carrier of the first conductivity type from the emitter electrode to the drift layer when the device is turned on.

4. The semiconductor device according to claim 1,
wherein the second emitter layer is formed as isolated patterns in contact with the trenches opposed to each other via the base layer in each dummy cell region.

5. The semiconductor device according to claim 1,
wherein the second emitter layer is formed as island shaped patterns each having opposite ends in contact with the trenches opposed to each other via the base layer in each dummy cell region.

6. The semiconductor device according to claim 1 further comprising a via contact formed in contact with the second emitter layer to connect the base layer in the dummy cell region to the emitter electrode via the second emitter layer,
wherein resistance value of a floating resistor as a resistor between the base layer of the dummy cell region and the emitter electrode is adjusted by geometries of the second emitter layer and the via contact.

7. The semiconductor device according to claim 6,
wherein the resistance value of the floating resistor is 0.3–3 Ω when the applied voltage between the collector and the emitter is 600 V and the gate resistance is 51 Ω.

8. The semiconductor device according to claim 1,
wherein resistance value of a floating resistor as a resistance between the base layer of the dummy cell region and the emitter electrode is adjusted to be smaller than the resistance value causing rise of the gate-emitter voltage due to negative capacitance of the gate in a period to charge a gate charge between the gate and the collector by a voltage applied between the gate and the emitter when the device is turned on.

9. The semiconductor device according to claim 8,
wherein the drift layer of the main cell region has a carrier concentration profile having a peak on the side of the first emitter layer.

10. The semiconductor device according to claim 9,
wherein the drift layer of the main cell region forms a current path narrow enough to accumulate a carrier of the second conductivity type on and around the bottom of the trenches when the device is turned on, and wherein the second emitter layer forms a current path conducting a carrier of the second conductivity type to the emitter electrode by an amount not affecting the injection efficiency of the carrier of the first conductivity type from the emitter electrode to the drift layer when the device is turned on.

11. The semiconductor device according to claim 8 further comprising a via contact formed in contact with the second emitter layer to connect the base layer in each dummy cell region to the emitter electrode via the second emitter layer,
wherein the resistance value of the floating resistor is adjusted by geometries of the second emitter layer and the via contact.

12. The semiconductor device according to claim 8,
wherein the second emitter layer is formed as isolated patterns in contact with the trenches opposed to each other via the base layer in each dummy cell region.

13. The semiconductor device according to claim 8,
wherein the second emitter layer is formed as island shaped patterns each having opposite ends in contact with the trenches opposed to each other via the base layer in each dummy cell region.

14. The semiconductor device according to claim 8,
wherein the resistance value of the floating resistor is 0.3–3 Ω when the applied voltage between the collector and the emitter is 600 V and the gate resistance is 51 Ω.

* * * * *